United States Patent
Chu et al.

(10) Patent No.: US 7,432,117 B2
(45) Date of Patent: Oct. 7, 2008

(54) LIGHT-EMITTING DIODE AND MANUFACTURING METHOD THEREOF

(75) Inventors: Chang-Hsing Chu, Taichung Hsien (TW); Kui-Hui Yu, Chia Yi Hsien (TW); Shi-Ming Chen, Tainan (TW)

(73) Assignee: Epistar Corporation, Hsinchu (TW)

( * ) Notice: Subject to any disclaimer, the term of this patent is extended or adjusted under 35 U.S.C. 154(b) by 344 days.

(21) Appl. No.: 11/232,633

(22) Filed: Sep. 22, 2005

(65) Prior Publication Data
US 2006/0255356 A1 Nov. 16, 2006

(30) Foreign Application Priority Data
May 12, 2005 (TW) ............... 94115424 A

(51) Int. Cl.
*H01L 21/00* (2006.01)
(52) U.S. Cl. ........... 438/22; 257/E33.065; 257/E33.068
(58) Field of Classification Search .................. 438/22, 438/26; 257/E33.065, E33.068
See application file for complete search history.

(56) References Cited

U.S. PATENT DOCUMENTS

| 6,420,732 | B1 * | 7/2002 | Kung et al. ............ 257/79 |
| 6,642,072 | B2 * | 11/2003 | Inoue et al. ............ 438/26 |
| 2006/0006404 | A1 * | 1/2006 | Ibbetson et al. ........ 257/99 |
| 2006/0261364 | A1 * | 11/2006 | Suehiro et al. ........ 257/100 |
| 2006/0284195 | A1 * | 12/2006 | Nagai et al. ............ 257/98 |
| 2007/0152226 | A1 * | 7/2007 | Salam ............ 257/79 |
| 2007/0181895 | A1 * | 8/2007 | Nagai ............ 257/98 |

* cited by examiner

*Primary Examiner*—Fernando L Toledo
(74) *Attorney, Agent, or Firm*—The Webb Law Firm

(57) ABSTRACT

A light-emitting diode and the manufacturing method thereof are provided, wherein the light-emitting diode comprises an epitaxial structure, a bonding layer and a composite substrate. The bonding layer located over one side of the epitaxial structure is used for adhering the composite substrate to the epitaxial structure. The composite substrate comprises a patterned silicon layer penetrated through by a plurality of openssilicon, and a metal layer covering the patterned silicon layer, wherein a portion of the metal layer is filled into the opens and contacts the bonding layer.

24 Claims, 8 Drawing Sheets

LIGHT-EMITTING DIODE AND MANUFACTURING METHOD THEREOF

RELATED APPLICATIONS

The present application is based on, and claims priority from, Taiwan Application Serial Number 94115424, filed May 12, 2005, the disclosure of which is hereby incorporated by reference herein in its entirety.

FIELD OF THE INVENTION

The present invention relates to a light-emitting diode (LED) and the manufacturing method thereof, and more particularly relates to an LED that has good thermal conductivity and good processability and the manufacturing method thereof.

BACKGROUND OF THE INVENTION

An LED is composed of an epitaxial structure such as a homo-structure, a single hetero-structure, a double hetero-structure or a multiple quantum well. An LED having a p-n junction interface that can emit light with various wavelengths has several characteristics, such as a low electrical power consumption, low heat generation, long operational life, small volume, good impact resistance, fast response and excellent stability; thus the LED has been popularly used in electrical appliances and electronic devices as a light source.

Typically, an LED is composed of an epitaxial structure having a substrate, an n-type cladding layer formed over the substrate, a p-type cladding layer and an active layer formed between the n-type cladding layer and the p-type cladding layer. Light is emitted as current flows through the epitaxial structure. The light wavelength can be altered by varying the composition of the epitaxial structure material.

To improve performance, an LED requires some downstream processes to increase its brightness, thermal conductivity or the effectiveness of current diffusion. The downstream processes, such as a cutting process, may require a substrate transferring technology or a wafer bonding technology for forming additional substrates made of metal or III-V semiconductor materials. Either copper having good thermal conductivity or silicon with good process abilities (for example, with high rigidity and low coefficient of thermal expansion) is appropriate for forming the additional substrates. However, applying copper or silicon individually cannot improve both the yield of the downstream processes and the performance of an LED simultaneously, even though copper has good thermal conductivity and silicon has good processability. The process yield can be improved with copper due to its high thermal conductivity, but its poor rigidity and large coefficient of thermal expansion creates bad processability, particularly when a thinner copper substrate is required. Meanwhile, the performance of an LED can be improved with silicon since its coefficient of thermal expansion compliments downstream processes, but its poor thermal conductivity creates poor process yield.

It is desired, therefore, to provide a method for forming an LED having good thermal conductivity and good processability so as to improve the yield and performance thereof.

SUMMARY OF THE INVENTION

One of the objectives of the present invention is to provide an LED having good thermal conductivity and good processability. The LED comprises an epitaxial structure, a bonding layer and a composite substrate. The bonding layer located over one side of the epitaxial structure is used for adhering the composite substrate to the epitaxial structure. The composite substrate comprises a patterned silicon layer that is covered by a metal layer and penetrated by at least one open, wherein the opens are filled in by a portion of the metal layer, such that the metal contacts the bonding layer.

Another objective of the present invention is to provide a manufacturing method for forming the aforementioned LED to improve the yield and performance thereof.

First, an epitaxial structure is formed on a first substrate. A second substrate is provided and patterned subsequently to form at least one open on a first surface of the second substrate. Then, an adhering process is conducted to adhere the first surface of the second substrate to the side of the epitaxial structure away from the first substrate. A portion of the patterned second substrate is removed to form at least one through-hole penetrating through the opens, wherein a portion of the bonding layer is exposed through the through-hole. A metal layer is then formed over the remaining second substrate to fill the through-hole and make electrical contact with the bonding layer before the first substrate is removed.

Accordingly, the feature of the present invention is to provide a composite substrate having good thermal conductivity via copper and good processability via silicon, so as to resolve the prior art problems by improving processing yield and the performance of an LED.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The feature of the present invention is to provide a composite substrate having good thermal conductivity via copper and good processability via silicon, so as to improve processing yield and the performance of an LED.

The foregoing aspects and many of the attendant advantages of this invention will become more readily appreciated as the same becomes better understood by reference to the following detailed description.

Figure 1:
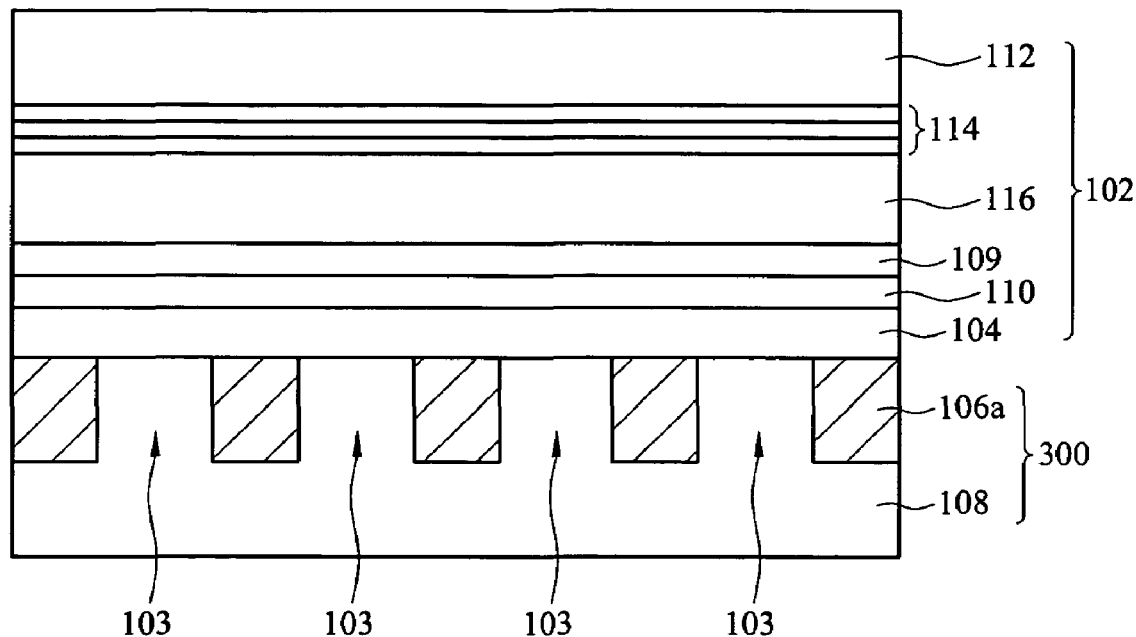
FIG. 1 illustrates a cross-sectional view of an LED structure, in accordance with the first embodiment of the present invention.

FIG. 1 illustrates a cross-sectional view of an LED structure, in accordance with the first embodiment of the present invention.

The LED comprises an epitaxial structure 102, a bonding layer 104 and a composite substrate 300. The bonding layer 104 located over one side of the epitaxial structure 102 is used for adhering the composite substrate 300 to the epitaxial structure 102. The composite substrate 300 comprises a patterned silicon layer 106a penetrated through by at least one open 103 and a metal layer 108 covering the patterned silicon layer 106a, wherein a portion of the metal layer 108 is filled in the opens 103.

Figure 2:
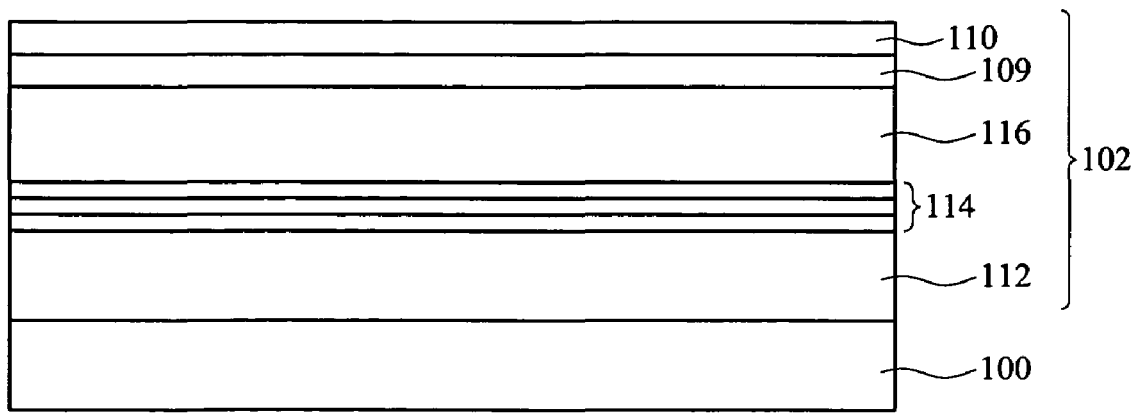
FIG. 2 illustrates a cross-sectional view of an epitaxial structure for forming the LED structure, in accordance with the first embodiment of the present invention.

FIG. 2 illustrates a cross-sectional view of an epitaxial structure for forming the LED structure, in accordance with the first embodiment of the present invention. According to the first embodiment of the present invention, forming the LED structure comprises the following steps:

First, an epitaxial structure 102 is formed on a first substrate 100. The epitaxial structure 102 is formed over the first substrate 100. In various embodiments of the present invention, the epitaxial structure 102 comprises a homo-structure, a single hetero-structure, a double hetero-structure, a multiple quantum well or any arbitrary combination thereof In the present embodiment, the epitaxial structure 102 includes an n-type cladding layer 112 made of AlGaInP, an active layer 114 and a p-type cladding layer 116 made of AlGaInP deposited sequentially over the first substrate 100 by an epitaxial process, wherein the active layer 114 is a multiple quantum well made of AlGaInP. In the present embodiment, the epitaxial structure 102 further comprises a contact layer 109 formed over the p-type cladding layer 116, and an anti-reflection layer 110 formed over the contact layer 109.

Figure 3A:
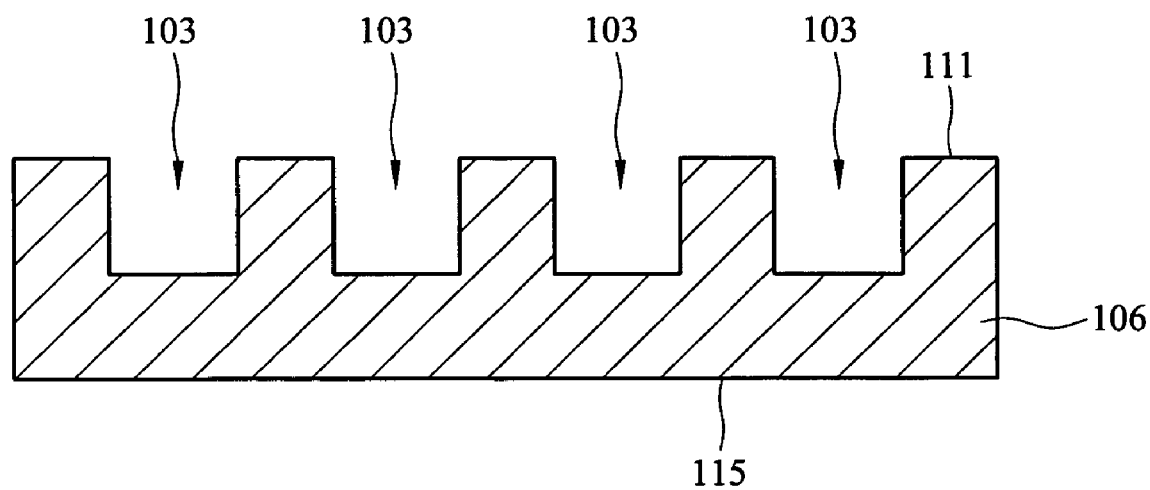
FIG. 3a illustrates a cross-sectional view of a patterned second substrate for forming the LED structure, in accordance with the first embodiment of the present invention.

FIG. 3a illustrates a cross-sectional view of a patterned second substrate 106 for forming the LED structure, in accordance with the first embodiment of the present invention. In the present invention, the second substrate 106 made of silicon and having a first surface 111 and a second surface 115. Then, a patterning process, such as an etch process, is conducted on the fist surface 111 to form at least one open 103.

Figure 3B:
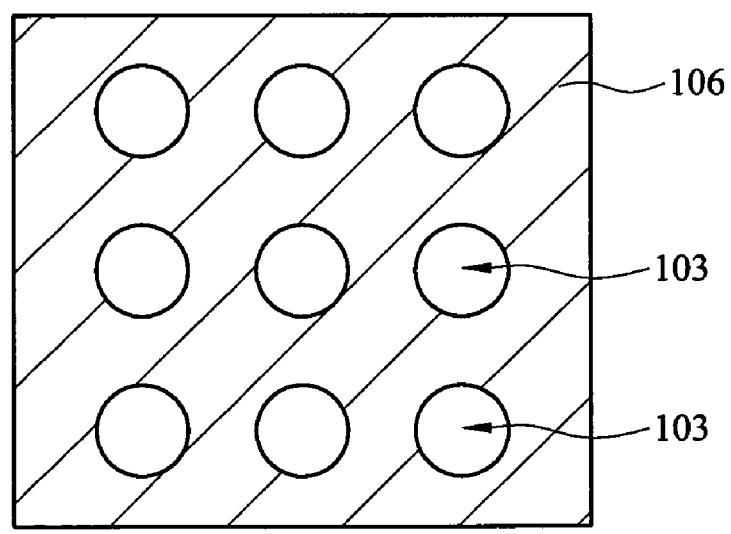
FIG. 3b illustrates a top view of the second substrate after the patterning process is conducted, in accordance with the first embodiment of the present invention.

FIG. 3b illustrates a top view of the second substrate after the patterning process is conducted. In various embodiments of the present invention, the shapes of the opens 103 are circular, triangular, rectangular, polygonal, irregular or any arbitrary combination thereof, and the opens are arranged regularly or irregularly. In the present embodiment, the opens 103 are circular and arranged regularly.

Next, an adhering process is conducted to adhere the first surface 111 of the second substrate 106 to the side of the epitaxial structure 102 away from the first substrate 100.

Figure 4:
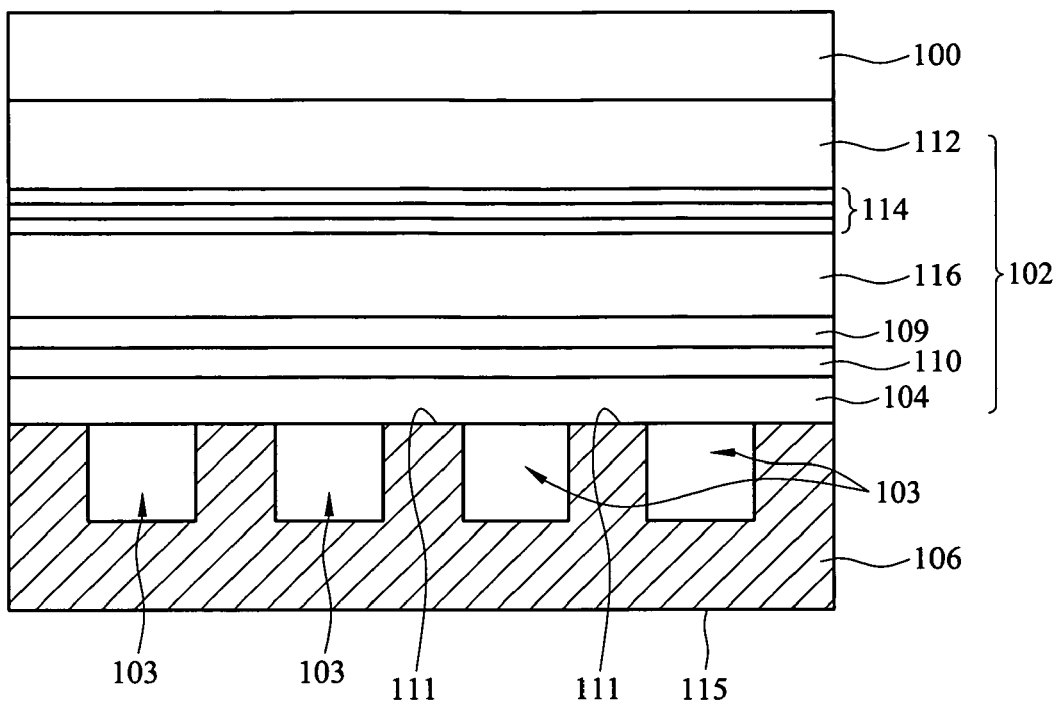
FIG. 4 is a cross-sectional view of the structure after the patterned second substrate is adhered to the epitaxial structure, in accordance with the first embodiment of the present invention.

FIG. 4 is a cross-sectional view of the structure after the patterned second substrate is adhered with the epitaxial structure, in accordance with the first embodiment of the present invention. In the present embodiment, the adhering process is conducted by the following steps. First, a bonding layer 104 is formed on the anti-reflection layer 110 of the epitaxial structure 102. For example, a bonding layer 104 including organic material, such as B-staged bisbenzocyclobutene (BCB) resin, metal material, such as AuBe/Au alloy, or the combination thereof is formed on the anti-reflection layer 110 of the epitaxial structure 102 by a spin coating process. Subsequently, a bonding process follows to adhere the first surface 111 of the patterned second substrate 106 to the bonding layer 104.

A portion of the patterned second substrate 106 is removed after the adhering process is conducted.

Figure 5:
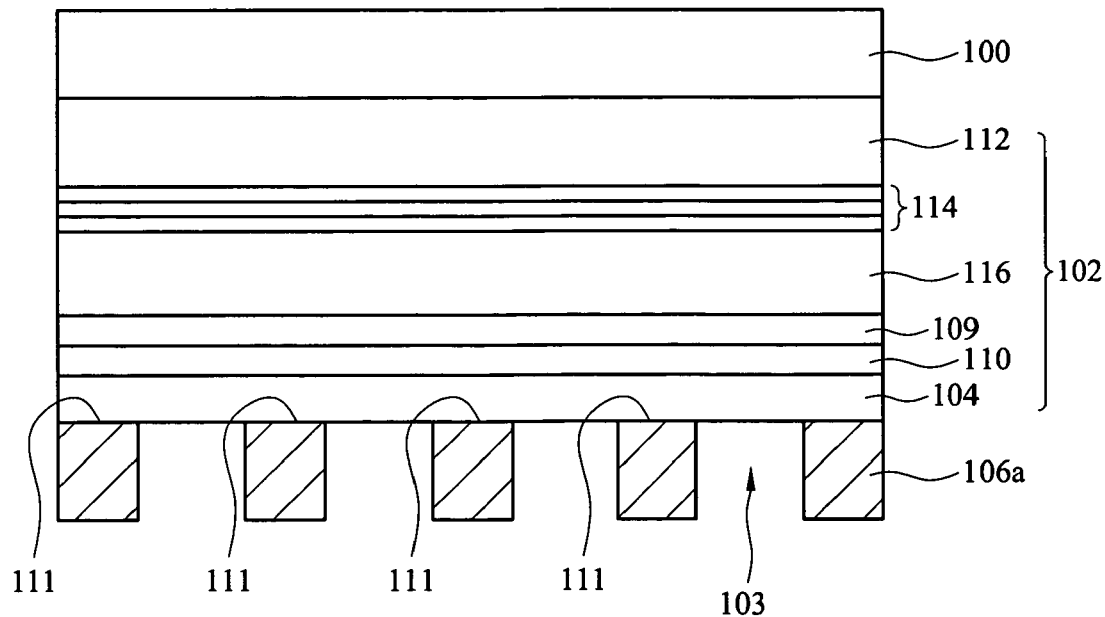
FIG. 5 is a cross-sectional view of the structure after a portion of the patterned second substrate is removed, in accordance with the first embodiment of the present invention.

FIG. 5 is a cross-sectional view of the structure after a portion of the patterned second substrate is removed, in accordance with the first embodiment of the present invention. In the present embodiment, a portion of the patterned second substrate 106 is removed by an etch process or a chemical mechanical polishing process to form at least one through-hole penetrating through the opens 103 and exposing a portion of the bonding layer 104 through the through-holes. The remaining portion of the patterned second substrate 106 formed as a patterned siliconlayer 106a has a thickness that is substantially between 1 μm and 200 μm.

Then, a metal layer 108 is formed over the patterned silicon layer 106a.

Figure 6:
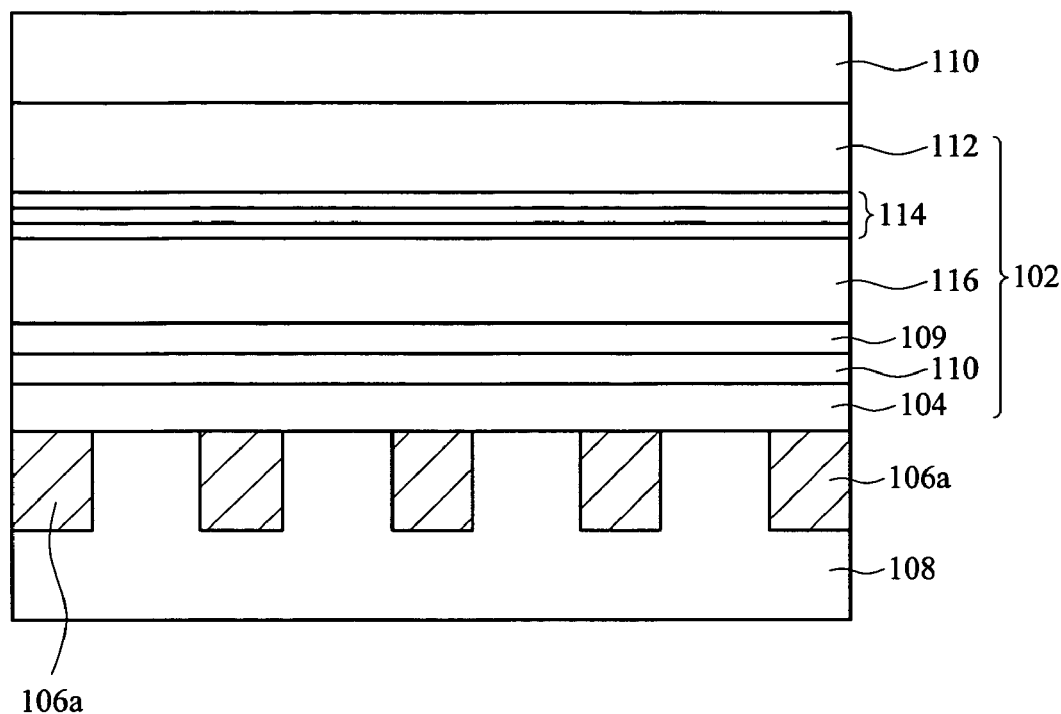
FIG. 6 is a cross-sectional view of the structure after a metal layer is formed over the patterned silicon layer, in accordance with the first embodiment of the present invention.

FIG. 6 is a cross-sectional view of the structure after the metal layer is formed over the patterned silicon layer, in accordance with the first embodiment of the present invention. A sputtering process, anodic oxidation process or the combination thereof forms the metal layer 108. The thickness of the metal layer 108 is substantially between 0.5 μm and 100 μm. In addition, a portion of the metal layer 108 is filled into the through-holes penetrating through the opens 103 and contacts the bonding layer 104.

The structure of the metal layer 108 depends on the steps of sputtering process selected for forming thereof For example, the metal layer 108 can be a single metal layer structure, multi-hetero metal interlace structure, single layer alloy structure or any combination thereof and depends on the various sputtering steps, such as co-deposition, interlaced deposition and single deposition, and the material used for the sputtering process. The material of the metal layer 108 can be Cu, Ni, CuO or Cu/Ni alloy and is deposited over the patterned silicon layer 106a. In the present embodiment, the metal layer 108 is made of copper. The metal layer 108 comprises a single copper structure, a Cu/Ni interlace structure or a Cu/Ni alloy structure.

Next, the first substrate 100 is removed to produce the structure illustrated in FIG. 1.

Another method for forming the LED structure is disclosed by the second embodiment. The method of the second embodiment is substantially similar to the first embodiment, merely varying in the methods for forming the patterned silicon layer.

Figure 7:
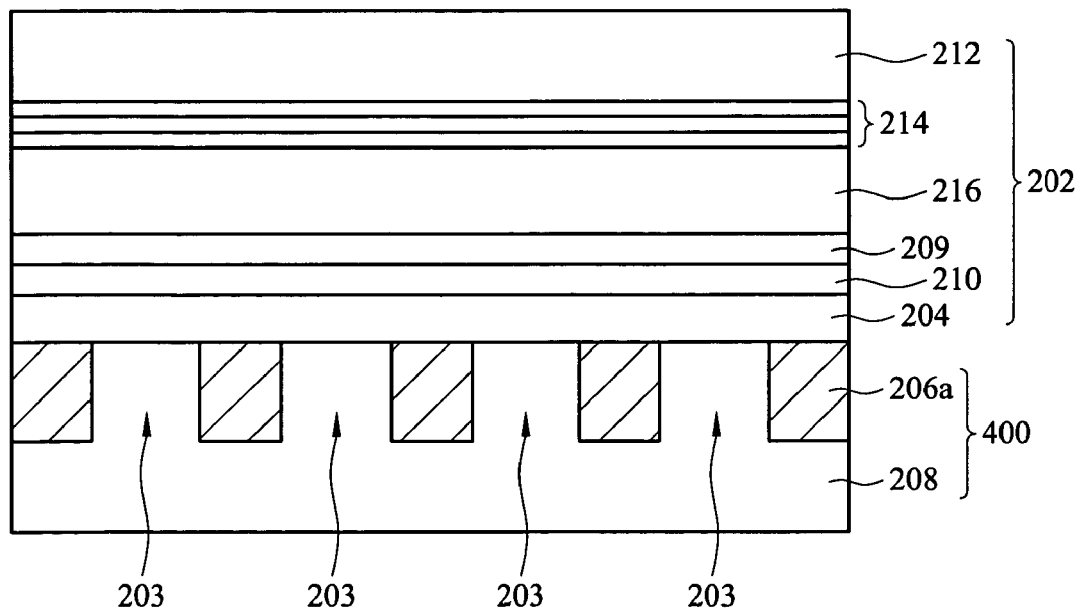
FIG. 7 illustrates a cross-sectional view of an LED structure, in accordance with the second embodiment of the present invention.

FIG. 7 illustrates a cross-sectional view of an LED structure, in accordance with the second embodiment of the present invention. The LED comprises an epitaxial structure 202, a bonding layer 204 and a composite substrate 400. The bonding layer 204 located over one side of the epitaxial structure 202 is used for adhering the composite substrate 400 to the epitaxial structure 202. The composite substrate 300 comprises a patterned silicon layer 206a penetrated by at least one open 203 silicon, and a metal layer 208 covering the patterned silicon layer 206a, wherein a portion of the metal layer 208 is filled in the opens 203.

Figure 8:
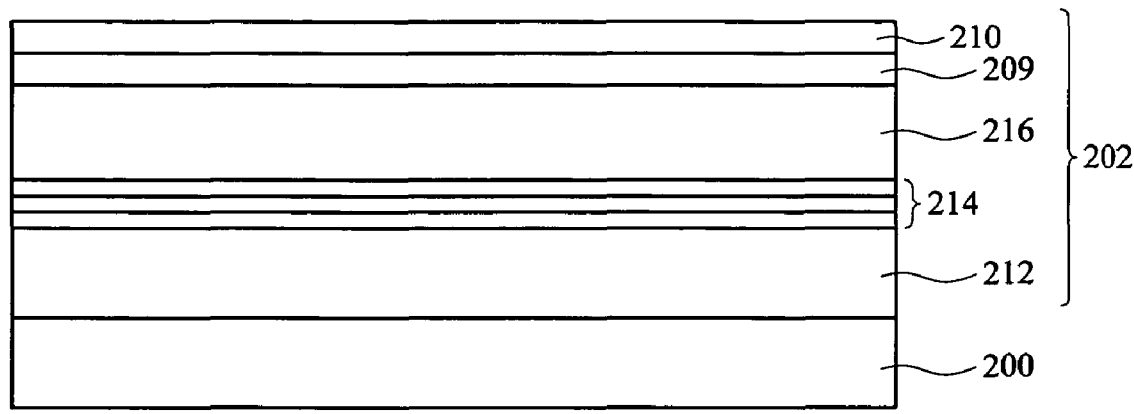
FIG. 8 illustrates a cross-sectional view of an epitaxial structure for forming the LED structure, in accordance with the second embodiment of the present invention.

FIG. 8 illustrates a cross-sectional view of an epitaxial structure for forming the LED structure, in accordance with the second embodiment of the present invention. According to the second embodiment of the present invention, forming the LED structure comprises the following steps:

First, an epitaxial structure 202 is formed on a first substrate 200. The epitaxial structure 202 is formed over the first substrate 200. In various embodiments of the present invention, the epitaxial structure 202 comprises a homo-structure, a single hetero-structure, a double hetero-structure, a multiple quantum well, or any arbitrary combination thereof In the present embodiment, the epitaxial structure 202 includes an n-type cladding layer 212 made of AlGaInP, an active layer 214 and a p-type cladding layer 216 made of AlGaInP deposited sequentially over the first substrate 200 by an epitaxial process, wherein the active layer 214 is a multiple quantum well made of AlGaInP. In the present embodiment, the epitaxial structure 202 further comprises a contact layer 209 formed over the p-type cladding layer 216, and an anti-reflection layer 210 formed over the contact layer 209.

Simultaneously, a second substrate 206 is provided. In the present invention, the second substrate 206 is made of silicon and has a first surface 211 and a second surface 215. Then, an adhering process is conducted to adhere the first surface 211 of the second substrate 206 to the side of the epitaxial structure 202 away from the first substrate 200.

Figure 9:
FIG. 9 is a cross-sectional view of the structure after a second substrate is adhered to the epitaxial structure, in accordance with the second embodiment of the present invention.

FIG. 9 is a cross-sectional view of the structure after the second substrate is adhered to the epitaxial structure, in accordance with the second embodiment of the present invention. In the present embodiment, the adhering process is conducted by the following steps. First, a bonding layer 204 is formed on the anti-reflection layer 210 of the epitaxial structure 202. For example, a bonding layer 204 including organic material, such as B-staged bisbenzocyclobutene (BCB) resin, metal material, such as AuBe/Au alloy, or the combination thereof is formed on the anti-reflection layer 210 of the epitaxial structure 202 by a spin coating process. Subsequently, a bonding process follows to adhere the first surface 211 of the second substrate 106 to the bonding layer 204.

A portion of the second substrate 206 is removed after the adhering process is conducted.

Figure 10A:
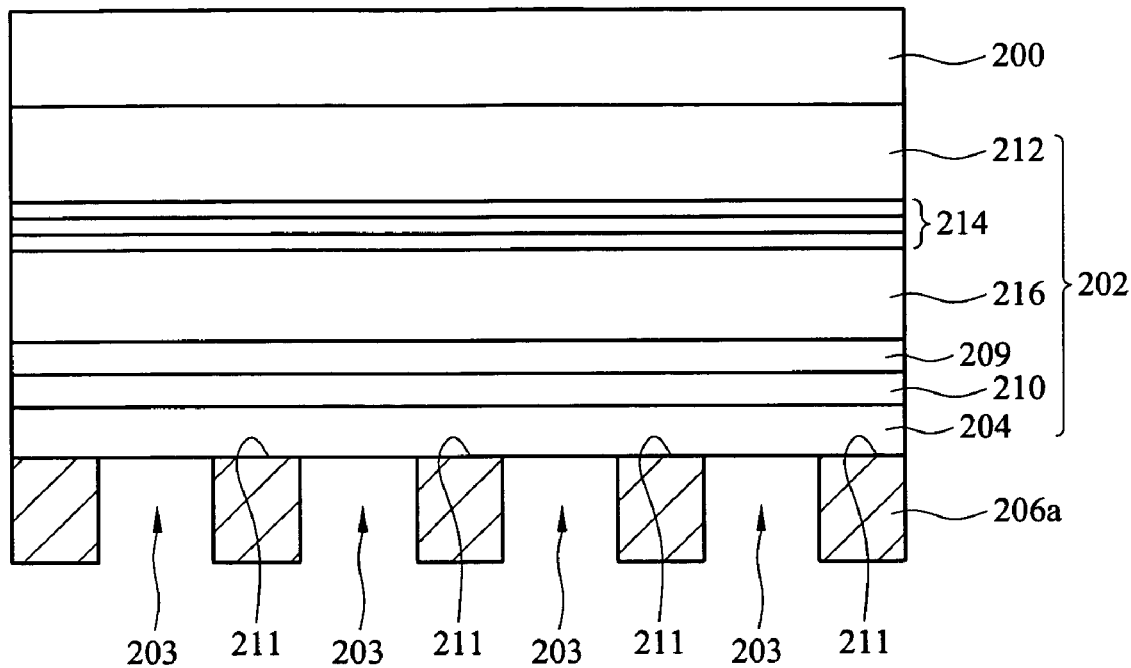
FIG. 10a is a cross-sectional view of the structure after a portion of the second substrate is removed, in accordance with the second embodiment of the present invention.

FIG. 10a is a cross-sectional view of the structure after a portion of the second substrate is removed, in accordance with the second embodiment of the present invention. In the present embodiment, a portion of the second substrate 206 is removed by an etch process or a chemical mechanical polishing process to form at least one penetrating open 203 exposing a portion of the bonding layer 204. The remaining portion of the patterned second substrate 206 formed as a patterned silicon layer 206a has a thickness that is substantially between 1 μm and 200 μm.

Figure 10B:
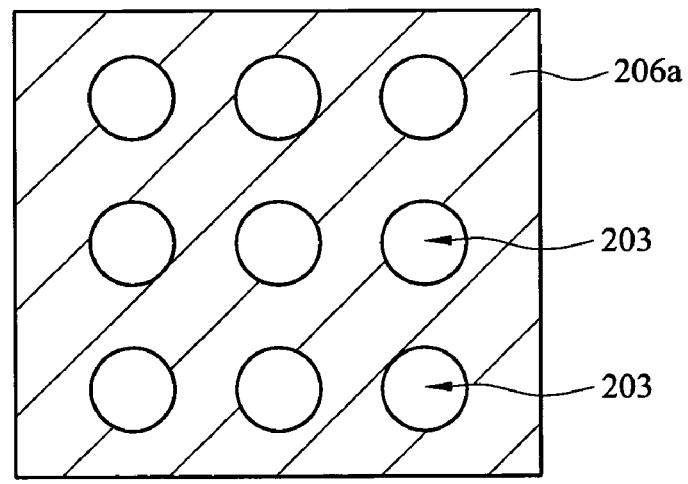
FIG. 10b illustrates a top view of the second substrate after the patterned silicon layer is formed, in accordance with the second embodiment of the present invention.

FIG. 10b illustrates a top view of the second substrate after the patterned silicon layer is formed. In some embodiments of the present invention, the shapes of the penetrating opens 203 are circular, triangular, rectangular, polygonal, irregular or any arbitrary combination thereof, and the penetrating opens 203 are arranged regularly or irregularly. In the present embodiment, the penetrating opens 203 are circular and arranged regularly.

Next, a metal layer 208 is formed over the patterned silicon layer 206a.

Figure 11:
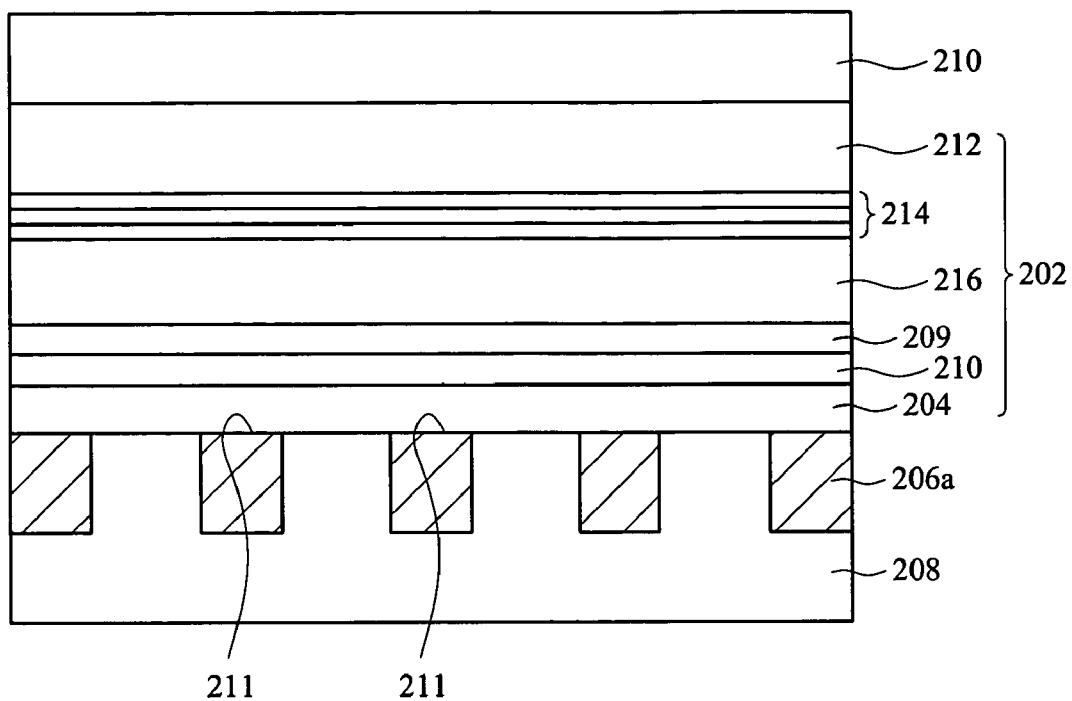
FIG. 11 is a cross-sectional view of the structure after a metal layer is formed over the patterned silicon layer, in accordance with the second embodiment of the present invention.

FIG. 11 is a cross-sectional view of the structure after the metal layer is formed over the patterned silicon layer 106a, in accordance with the second embodiment of the present invention. A sputtering process, anodic oxidation process or the combination thereof forms the metal layer 208. The thickness of the metal layer 208 is substantially between 0.5 μm and 100 μm. In addition, a portion of the metal layer 208 is filled into the through-holes penetrating through the opens 203 and contacts the bonding layer 204.

The structure of the metal layer 208 depends on the steps of sputtering process selected for forming thereof. For example, the metal layer 208 is a single metal layer structure, multi-hetero metal interlace structure, single layer alloy structure or any combination thereof depending on the various sputtering steps, such as co-deposition, interlaced deposition and single deposition, and the material used for the sputtering process. The material of the metal layer 208 can be Cu, Ni, CuO or Cu/Ni alloy and is deposited over the patterned silicon layer 106a. In the present embodiment, the metal layer 208 is made of copper. The metal layer 208 comprises a single copper structure, a CuNi interlace structure or a Cu/Ni alloy structure.

Then, the first substrate 200 is removed to produce the structure illustrated in FIG. 7.

In the preferred embodiments of the present invention, the LED structure further comprises a first electrode and a second electrode.

Figure 12:
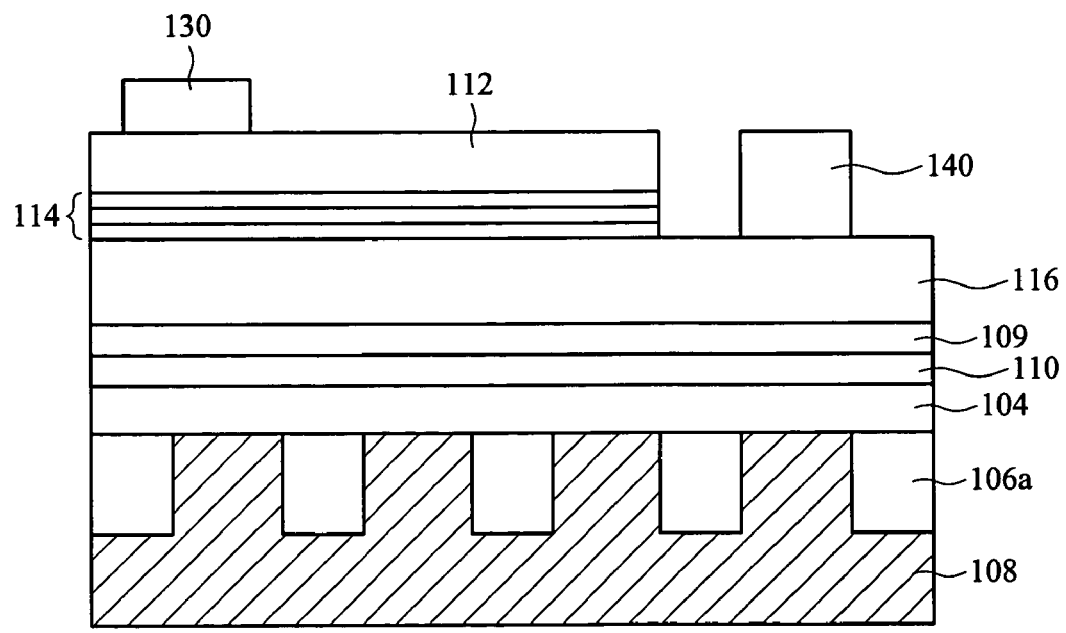
FIG. 12 is a cross-sectional view of the structure after a first electrode and a second electrode are formed on the epitaxial structure, in accordance with the first embodiment of the present invention.

FIG. 12 is a cross-sectional view of the structure after the first electrode and the second electrode are formed on the epitaxial structure, in accordance with the first embodiment of the present invention. In the present embodiment, the first electrode 130 and the second electrode 140 are located on the epitaxial structure 102 on the same side of the patterned silicon layer 106a.

The following steps form the first electrode 130 and the second electrode 140:

First, an etch process is conducted from the n-type cladding layer 112 downward through the active layer 114 to the p-type cladding layer 116, so that a portion of the p-type cladding layer 116 is exposed. Then, the first electrode 130 and the second electrode 140 are formed on the n-type cladding layer 112 and the p-type cladding layer 116 respectively by a deposition process.

In another preferred embodiment, the first electrode 130 and the second electrode 140 are connected on the epitaxial structure 102 and respectively located on different sides of the patterned silicon layer 106a.

Figure 13:
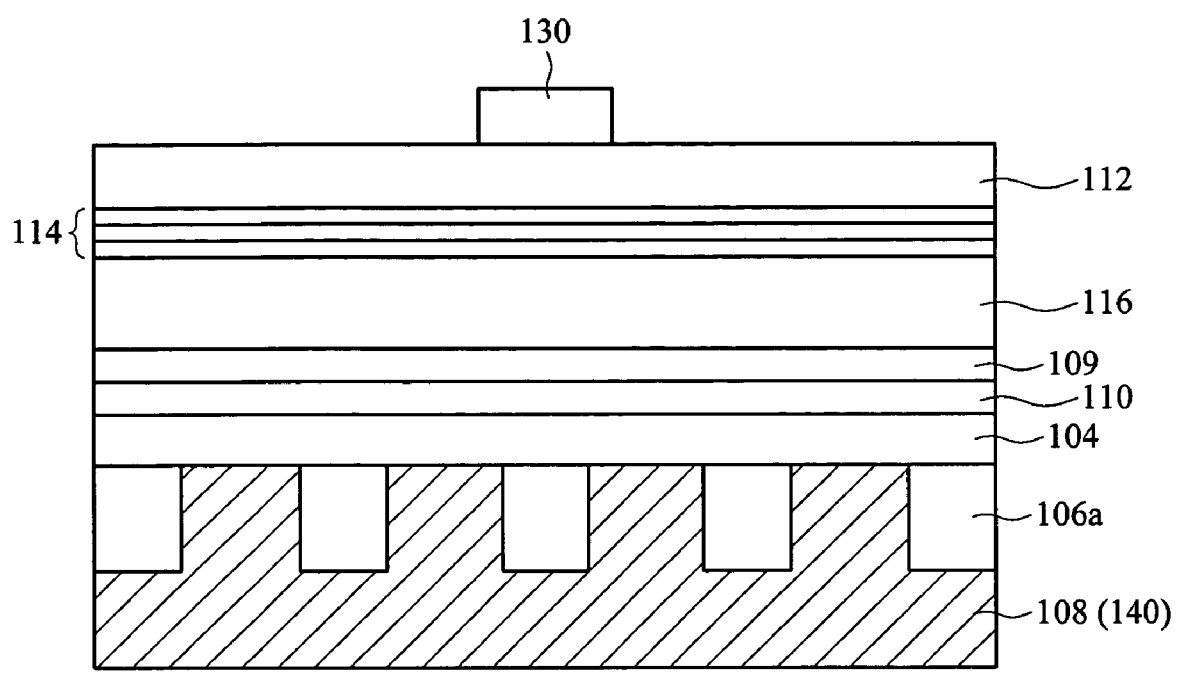
FIG. 13 is a cross-sectional view of another structure after a first electrode and a second electrode are formed on the epitaxial structure, in accordance with the first embodiment of the present invention.

FIG. 13 is a cross-sectional view of another structure after the first electrode and the second electrode are formed on the epitaxial structure, in accordance with the first embodiment of the present invention. In the present embodiment, the metal layer 108 acts as the second electrode 140, and the first electrode 130 is formed on the n-type cladding layer 112 by a deposition process.

Accordingly, the advantage of the present invention is to provide a composite substrate having good thermal conductivity via copper and good processability via silicon, so as to resolve the prior art problems to improve the processing yield and performance of an LED.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming an LED comprising:
   providing a first substrate;
   forming an epitaxial structure on the first substrate;
   providing and patterning a second substrate, to form at least one opening on a first surface of the second substrate;
   forming a bonding layer on the surface of the epitaxial structure away from the first substrate;
   adhering the first surface of the second substrate to the bonding layer;
   removing at least one portion of the second substrate beneath the opening so as to form at least one through-hole penetrating through the opening and exposing a portion of the bonding layer through the through-holes;
   forming a metal layer over the remaining portion of the second substrate, wherein a portion of the metal layer is filled into the through-holes and contacts the bonding layer; and
   removing the first substrate.

2. The method of claim 1, wherein the epitaxial structure is selected from a group consisting of a homo-structure, a single hetero-structure, a double hetero-structure, a multiple quantum well and any arbitrary combination thereof.

3. The method of claim 1, wherein the forming of the epitaxial structure further comprises forming a contact layer and an anti-reflection layer on the side of the epitaxial structure away from the first substrate.

4. The method of claim 1, wherein the second substrate is patterned by an etch process conducted on the first surface of the second substrate.

5. The method of claim 1, wherein the second substrate is made of silicon.

6. The method of claim 1, wherein the adhering process comprises:
   forming a bonding layer on the side of the epitaxial structure away from the first substrate; and
   adhering the first surface of the second substrate to the epitaxial structure with the bonding layer.

7. The method of claim 6, wherein the bonding layer is selected from B-staged bisbenzocyclobutene (BCB) resin, AuBe/Au alloy and the combination thereof.

8. The method of claim 1, wherein the method for removing a portion of the second substrate is selected from a group consisting of an etch process, a chemical mechanical polishing process and the combination thereof.

9. The method of claim 1, wherein the method for forming the metal layer is selected from a group consisting of a sputtering process, anodic oxidation process and the combination thereof.

10. The method of claim 1, further comprising forming a first electrode and a second electrode contacting the epitaxial structure.

11. The method of claim 10, wherein the first electrode and the second electrode are located on the same side of the second substrate.

12. The method of claim 10, wherein the first electrode and the second electrode are respectively located on different sides of the second substrate.

13. A method of forming an LED comprising:
   providing a first substrate;
   forming an epitaxial structure on the first substrate;
   providing a second substrate with a first surface and a second surface;
   forming a bonding layer on the surface of the epitaxial structure away from the first substrate;
   adhering the entire first surface of the second substrate to the bonding layer;
   removing at least one portion of the second substrate to form at least one penetrating opening and exposing a portion of the bonding layer through the penetrating opening;
   forming a metal layer over the remaining portion of the second substrate, wherein a portion of the metal layer is filled into the penetrating opening and contacts the bonding layer; and
   removing the first substrate.

14. The method of claim 13, wherein the epitaxial structure is selected from a group consisting of a homo-structure, a single hetero-structure, a double hetero-structure, a multiple quantum well and any arbitrary combination thereof.

15. The method of claim 13, wherein the forming of the epitaxial structure further comprises forming a contact layer and an anti-reflection layer on the side of the epitaxial structure away from the first substrate.

16. The method of claim 13, wherein the portion of the second substrate is removed by an etch process conducted on the first surface of the second substrate.

17. The method of claim 13, wherein the second substrate is made of silicon.

18. The method of claim 13, wherein the adhering process comprises:
   forming a bonding layer on the side of the epitaxial structure away from the first substrate; and
   adhering the first surface of the second substrate to the epitaxial structure with the bonding layer.

19. The method of claim 18, wherein the bonding layer is selected from B-staged bisbenzocyclobutene (BCB) resin, AuBe/Au alloy and the combination thereof.

20. The method of claim 13, wherein the method for removing a portion of the second substrate is selected from a group consisting of an etch process, a chemical mechanical polishing process and the combination thereof.

21. The method of claim 13, wherein the method for forming the metal layer is selected from a group consisting of a sputtering process, an anodic oxidation process and the combination thereof.

22. The method of claim 13, further comprising forming a first electrode and a second electrode contacting the epitaxial structure.

23. The method of claim 22, wherein the first electrode and the second electrode are located on the same side of the second substrate.

24. The method of claim 22, wherein the first electrode and the second electrode are respectively located on different sides of the second substrate.

* * * * *